US008004178B2

(12) United States Patent
Lee

(10) Patent No.: US 8,004,178 B2
(45) Date of Patent: Aug. 23, 2011

(54) ORGANIC LIGHT EMITTING DIODE DISPLAY WITH A POWER LINE IN A NON-PIXEL REGION

(75) Inventor: In-Sook Lee, Suwon-si (KR)

(73) Assignee: Samsung Mobile Display Co., Ltd. (KR)

( * ) Notice: Subject to any disclaimer, the term of this patent is extended or adjusted under 35 U.S.C. 154(b) by 543 days.

(21) Appl. No.: 11/837,304

(22) Filed: Aug. 10, 2007

(65) Prior Publication Data

US 2008/0252203 A1 Oct. 16, 2008

(30) Foreign Application Priority Data

Apr. 13, 2007 (KR) .......................... 10-2007-0036456

(51) Int. Cl.
*H05B 33/06* (2006.01)
*H05B 33/00* (2006.01)
*G09G 3/30* (2006.01)

(52) U.S. Cl. .......... 313/504; 313/500; 313/506; 345/76; 345/80

(58) Field of Classification Search ........... 313/504–506
See application file for complete search history.

(56) References Cited

U.S. PATENT DOCUMENTS

| 6,525,704 | B1 * | 2/2003 | Kondo et al. ................. 345/78 |
| 6,972,517 | B2 * | 12/2005 | Park .............................. 313/504 |
| 2003/0168966 | A1 * | 9/2003 | Kobayashi et al. ........... 313/495 |
| 2004/0081751 | A1 * | 4/2004 | Nakanishi et al. ............ 427/108 |
| 2005/0023956 | A1 * | 2/2005 | Kwak et al. ................... 313/495 |
| 2005/0057461 | A1 * | 3/2005 | Suh et al. ........................ 345/76 |
| 2005/0184672 | A1 * | 8/2005 | Lee ............................. 315/169.3 |
| 2005/0195355 | A1 * | 9/2005 | Kwak et al. ................... 349/149 |
| 2006/0125407 | A1 * | 6/2006 | Jeong .......................... 315/169.3 |
| 2006/0238463 | A1 * | 10/2006 | Kim et al. ....................... 345/80 |

FOREIGN PATENT DOCUMENTS

| KR | 10-2005-0051699 A | 6/2005 |
| KR | 10-2005-0081540 A | 8/2005 |
| KR | 10-2005-0115173 A | 12/2005 |
| KR | 10-2006-0047070 A | 5/2006 |

* cited by examiner

*Primary Examiner* — Sikha Roy
(74) *Attorney, Agent, or Firm* — Knobbe Martens Olson & Bear LLP

(57) ABSTRACT

An organic light emitting diode display comprises a substrate having a pixel area and a non-pixel area, a plurality of pixels formed in the pixel area, a power line with a uniform width formed in the non-pixel area configured to supply a common power voltage to the pixels, a cathode electrode formed on the substrate, and a cathode power line formed in the non-pixel area on the same layer as the power line and coupled to the cathode electrode to supply a cathode voltage to the pixels, wherein each pixel comprises a thin film transistor and an organic light emitting element.

20 Claims, 3 Drawing Sheets

ORGANIC LIGHT EMITTING DIODE DISPLAY WITH A POWER LINE IN A NON-PIXEL REGION

CROSS-REFERENCE TO RELATED APPLICATION

This application claims priority to and the benefit of Korean Patent Application No. 10-2007-0036456 filed in the Korean Intellectual Property Office on Apr. 13, 2007, the entirety of which is incorporated herein by reference.

BACKGROUND OF THE INVENTION

1. Technical Field

This disclosure relates generally to an organic light emitting diode (OLED) display, and more particularly, to an OLED display with improved luminance uniformity.

2. Description of Related Art

An organic light emitting diode (OLED) display is a self-emissive display in which light of desired wavelength is emitted by excitons formed by recombination of electrons and holes. Because an OLED display does not require a separate light source, for example, a backlight, some exhibit advantages including reduced power consumption, wide viewing angles, and fast response. Accordingly, OLED displays have been proposed as next generation displays. OLED displays are classified as passive matrix displays and active matrix displays. Recently, active matrix displays with low power consumption, small dot pitch, fast response, wide viewing angles, and slim form factors have been widely used.

An active matrix OLED display comprises a substrate on which a pixel area is formed. A non-pixel area surrounding the pixel area comprises data, scan, and light emission signal drivers, which drive each of the pixels. The non-pixel area further comprises a power line (ELVDD), which supplies a common voltage to the pixels, and a cathode power line (ELVSS), which supplies cathode voltages to the OLED elements. In displays for small mobile devices, the power line (ELVDD) is generally formed along one edge of the pixel or display area which reduces dead space in the display. The power line (ELVDD) typically has a uniform line width from one end of the edge to the middle of the edge. However, the power line is much narrower from the middle to the other end of the edge. The cathode power line (ELVSS) is formed adjacent to the narrow portion of the power line (ELVDD).

The change in width of the power line (ELVDD) causes a voltage drop (IR drop) in the narrower portion, which in turn causes a luminance deviation between the two portions of the display area corresponding to the wider and narrower portions of the power line. Degradation of OLED elements exposed to the higher voltages disposed proximal to a power input terminal of the power line, which are and exhibit the highest luminances.

SUMMARY OF THE INVENTION

Embodiments of an OLED display disclosed herein exhibit any combination of improved luminance uniformity and/or reduced degradation of OLED elements thereof, using novel power line (ELVDD) and a cathode power line (ELVSS) structures.

In an exemplary embodiment, an organic light emitting diode display includes a substrate having a pixel area and a non-pixel area, a plurality of pixels that are formed in the pixel area, each pixel including a thin film transistor and an organic light emitting element, a power line (ELVDD) that is formed with a uniform width in the non-pixel area to supply a common power voltage to the pixels, a cathode electrode formed on the substrate, and a cathode power line (ELVSS) that is formed in the non-pixel area at an identical layer to the power line and is coupled to the cathode electrode to supply a cathode voltage to the pixels.

The cathode power line may be divided into two sections between which the power input terminal of the power line is disposed. The cathode power line that is divided into the two sections may be electrically insulated from the power line. The two sections of the cathode power line may be electrically interconnected by a conductive layer formed on a different layer from the power line.

The organic light emitting diode display may further include a passivation layer that is formed between the cathode power line and the power line to insulate the cathode power line from the power line, and an over-coating layer formed on the passivation layer.

The conductive layer may be formed of the same material as an electrode of the organic light emitting diode element. The electrode may be an anode electrode.

The cathode power line may be disposed in parallel with the power line but insulated from the power line. A width of the cathode power line may be identical to that of the power line. A length of the cathode power line may be substantially the same as a length of the power line. A length of a region where the cathode power line is connected to the power line may be substantially same as a length of the cathode power line.

Some embodiments provide an organic light emitting diode display comprising: a substrate comprising a pixel area and a non-pixel area; a plurality of pixels formed in the pixel area, each pixel comprising a thin film transistor and an organic light emitting diode element; a power line formed with a substantially uniform width in the non-pixel area configured to supply a common power voltage to the plurality of pixels; a cathode electrode formed on the substrate; a cathode power line formed in the non-pixel area on a same layer as the power line, coupled to the cathode electrode, and configured to supply a cathode voltage to the pixels; and at least one power input terminal coupled to each of the power line and the cathode power line.

In some embodiments, the cathode power line comprises two sections between which are disposed a power input terminal of the power line. In some embodiments, the two sections of the cathode power line are electrically insulated from the power line. In some embodiments, a conductive layer formed on a different layer from the power line electrically interconnects the two sections of the cathode power line. Some embodiments further comprise a passivation layer formed between the cathode power line and the power line, wherein the passivation layer insulates the cathode power line from the power line; and an over-coating layer formed on the passivation layer. In some embodiments, the conductive layer and an electrode of the organic light emitting diode element comprise the same material. In some embodiments, The organic light emitting diode display of claim 6, wherein the electrode is an anode.

In some embodiments, at least a portion of the cathode power line is disposed in parallel with the power line and electrically insulated from the power line. In some embodiments, a width of the cathode power line is substantially identical with a width of the power line. In some embodiments, a length of the cathode power line is substantially the same as a length of the power line. In some embodiments, the cathode power line is coupled to the cathode electrode over substantially the full length of the cathode power line.

Other embodiments provide a method for manufacturing an organic light emitting diode display, the method comprising: forming a plurality of pixels in a pixel area of a substrate, wherein each pixel comprises a this film transistor and an organic light emitting diode element; forming a power line with a substantially uniform width on a non-pixel area of the substrate, wherein the power line is coupled to the plurality of pixels; forming a cathode power line on the non-pixel area of the substrate; wherein the power line and cathode power line are formed on a common layer; forming at least one power input terminal coupled to each of power line and cathode power line; and forming a cathode electrode on the substrate, wherein the cathode terminal is coupled to the cathode power line and the plurality of pixels.

In some embodiments, forming the cathode power line comprises forming a cathode power line comprising a first section and a second section, and forming at least one power input terminal comprises forming a power input terminal disposed between the first and second sections of the cathode power line. Some embodiment further comprise forming a conductive layer on a different layer from the power line, wherein the conductive layer electrically interconnects the first and second sections of the cathode power line. In some embodiments, forming a conductive layer also comprises forming an electrode of the organic light emitting diode element.

Some embodiments further comprise forming a passivation layer between the cathode power line and the power line, wherein the passivation layer insulates the cathode power line from the power line; and forming an over-coating layer on the passivation layer.

In some embodiments, forming the cathode power line comprises forming at least a portion of the cathode power line in parallel with the power line and electrically insulated from the power line.

In some embodiments, forming the cathode power line comprises forming a cathode power line with a width that is substantially identical with a width of the power line.

In some embodiments, forming the cathode power line comprises forming a cathode power line with a length that is substantially the same as a length of the power line.

In some embodiments, the wherein the cathode terminal is coupled to the cathode power line over substantially the full length of the cathode power line.

DETAILED DESCRIPTION OF CERTAIN EMBODIMENTS

Figure 1:
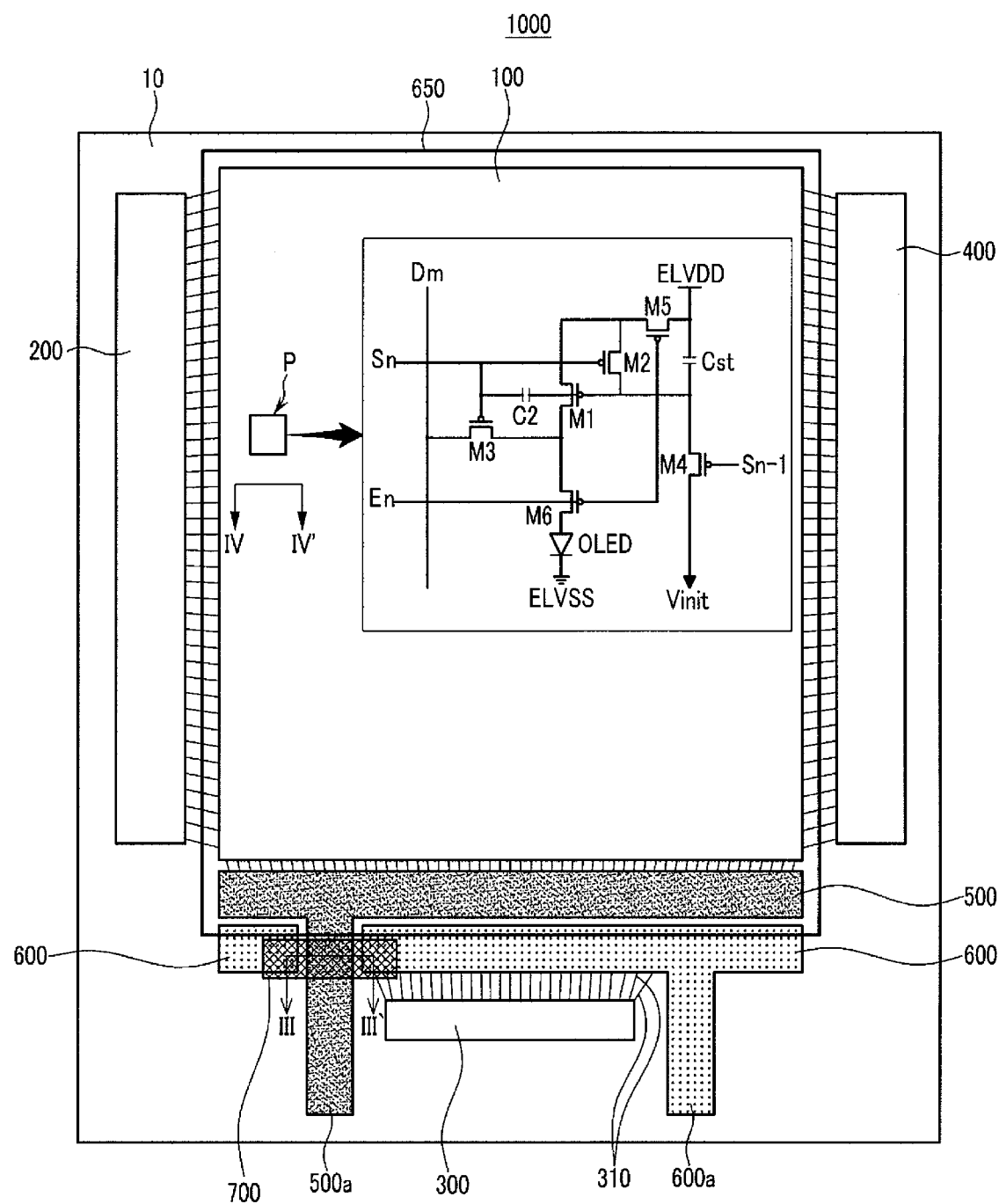
FIG. 1 is a schematic view of an embodiment of an OLED display.

Preferred embodiments are described more fully hereinafter with reference to the accompanying drawings. As those skilled in the art will realize, the described embodiments may be modified in various ways without departing from the spirit or scope of the present disclosure. Elements that are not related to the features of interest are not described. Like reference numerals denote like elements throughout the drawings, which are not to scale. Accordingly, in some cases, the thicknesses of layers, films, panels, regions, etc., are exaggerated for clarity. It will be understood that an element such as a layer, film, region, or substrate referred to as "on" another element can be directly on the other element or on one or more intervening elements. In contrast, no intervening elements are present when an element is referred to as being "directly on" another element. An element referred to as "coupled" to another element includes embodiments in which the element is "directly coupled" to another element, as well as embodiments in which the element is "electrically connected" to another element with one or more additional elements interposed therebetween. Furthermore, when a unit described as "including" a constituent element may further include other constituent elements in addition to the element, unless specifically referred to the contrary.

FIG. 1 is a schematic view of an embodiment of an OLED display 1000 comprising a display region 100 formed on a substrate 10, a scan driver 200, a data driver 300, a light emission control driver 400, a power line (ELVDD) 500, and a cathode power line (ELVSS) 600. A plurality of red, green, and blue pixels P comprising OLED elements are formed on the display region 100 in the illustrated embodiment. The red, green, and blue pixels P have identical circuit structures in the illustrated embodiment. The red, green, and blue pixels P emit red, green, and blue light, respectively, corresponding to currents applied to the OLED elements. Red, green, and blue pixels P are the basic units for displaying an image because any desired color may be produced by combining the light emitted by the pixels P.

The scan driver 200, the data driver 300, and/or the light emission control driver 400 are electrically coupled to the display region 100 by a plurality of wires or lines. The scan driver 200, the data driver 300, and/or the light emission control driver 400 may be provided in the form of chips or integrated device which can be mounted on tape carrier packages (TCP) that are adhered and electrically coupled to wires or lines disposed thereon.

The pixels P receive data signals from the data driver 300 through a data line $D_m$. A scan line $S_n$ provides selection signals to the pixel circuits from the scan driver 200. The scan driver 200 generates a sequence of selection signals, which are carried by a plurality of scan lines $S_1, S_2, \ldots S_{n-1}$, and $S_n$. The data driver 300 generates a data voltages corresponding to image signals, which are carried by a plurality of data lines $D_1, D_2, \ldots D_{n-1}$, and $D_m$. Light emission control driver 400 sequentially applies light emission control signals, which control the light emission of the OLED elements of the respective pixels P. Light emission control signals are carried by light emission control lines $E_1, E_2, \ldots E_{n-1}$, and $E_n$.

Each pixel P comprises a driving circuit comprising an OLED element, a data line $D_m$, scan lines $S_{n-1}$ and $S_n$, and a light emission control line $E_n$. The driving circuit is coupled to the power line (ELVDD) 500 and an initializing line $V_{init}$, which generate a driving current sufficient to cause the OLED element to emit light.

Figure 3:
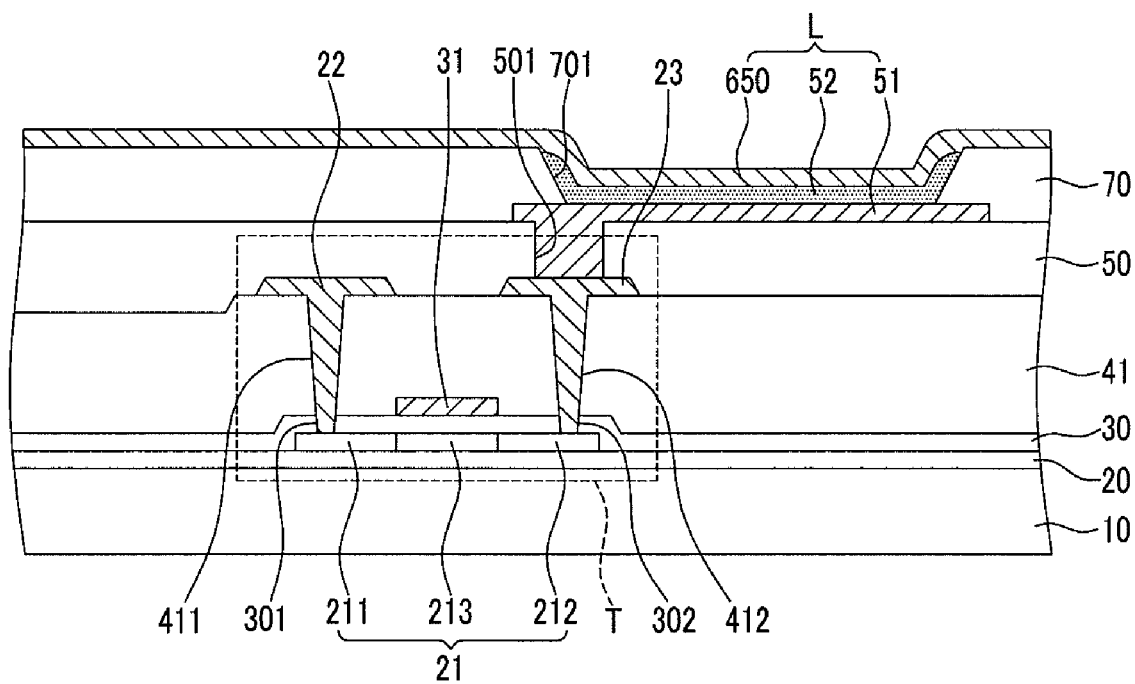
FIG. 3 is a cross-sectional view taken along section IV-IV' of FIG. 1.

As shown in FIG. 3, the OLED element comprises an anode electrode 51, an organic light emitting layer 52, and a cathode electrode 650. As illustrated in FIG. 1, the anode electrode 51 is coupled to the remainder of the driving circuit. The cathode electrode 650 is coupled to the cathode power line (ELVSS) 600, which is in turn coupled to a cathode power source, which may be a ground voltage or a negative voltage that is lower than a common power source voltage.

In the embodiment, illustrated in FIG. 1, the driving circuit of the pixel P comprises six transistors M1, M2, M3, M4, M5, and M6, and two capacitors C1 and C2. Those skilled in the art will understand that other embodiments use different driving circuits. For example, in some embodiments the driving circuit of the pixel P comprises at least two transistors and at least one capacitor.

The power line (ELVDD) 500 supplies a common power source voltage to the pixels P. In the illustrated embodiment, the power line (ELVDD) 500 is formed along one side or edge of the display region 100 of the substrate 10. With reference to FIG. 1, the power line (ELVDD) 500 is formed on the edge of the substrate 10 below the display region 100. Because the power line (ELVDD) 500 is not formed around a circumference of the display region 100, but only below the display region 100, dead space is reduced, thereby reducing the size of the display 1000. In the illustrated embodiment the power line (ELVDD) 500 comprises one power input terminal 500*a*, which is electrically coupled, for example, to a flexible printed circuit. Other embodiments comprise a plurality of power input terminals. Here, the power line (ELVDD) 500 is configured to have a generally uniform width, and thus, a generally uniform resistance throughout its entire length. In some embodiments, the uniformity of the width of the power line (ELVDD) 500 is at least about 70%, at least about 75%, at least about 80%, at least about 85%, at least about 90%, at least about 95%, at least about 97%, at least about 99%, and/or at least about 99.5%. Therefore, although the illustrated embodiment comprises a single power input terminal 500*a*, the uniform width of the power line (ELVDD) 500 reduces voltage drop (IR drop) along its length, thereby reducing deviations in luminance in the pixels P. Furthermore, the uniformity in voltage reduces degradation of OLED elements of pixels P disposed near the power input terminal 500*a*.

The cathode power line (ELVSS) 600 is formed on the substrate 10 parallel to the power line (ELVDD) 500, and insulated from the power line (ELVDD) 500. The cathode power line (ELVSS) 600 is coupled to a cathode electrode 650 (FIG. 3) formed on the display region 100 and the power line (ELVDD) 500. In the illustrated embodiment, the cathode power line (ELVSS) 600 is coupled to the cathode electrode 650 substantially along its entire length.

In some embodiments the cathode power line (ELVSS) 600 is formed on the same layer as the power line (ELVDD) 500, and is disposed close to the power line (ELVDD) 500. In the illustrated embodiment, the cathode power line (ELVSS) 600 is divided into two sections between which the power input terminal 500*a* coupled to the power line (ELVDD) 500 is interposed. Those skilled in the art will understand that other arrangements are used in other embodiments.

Figure 2:
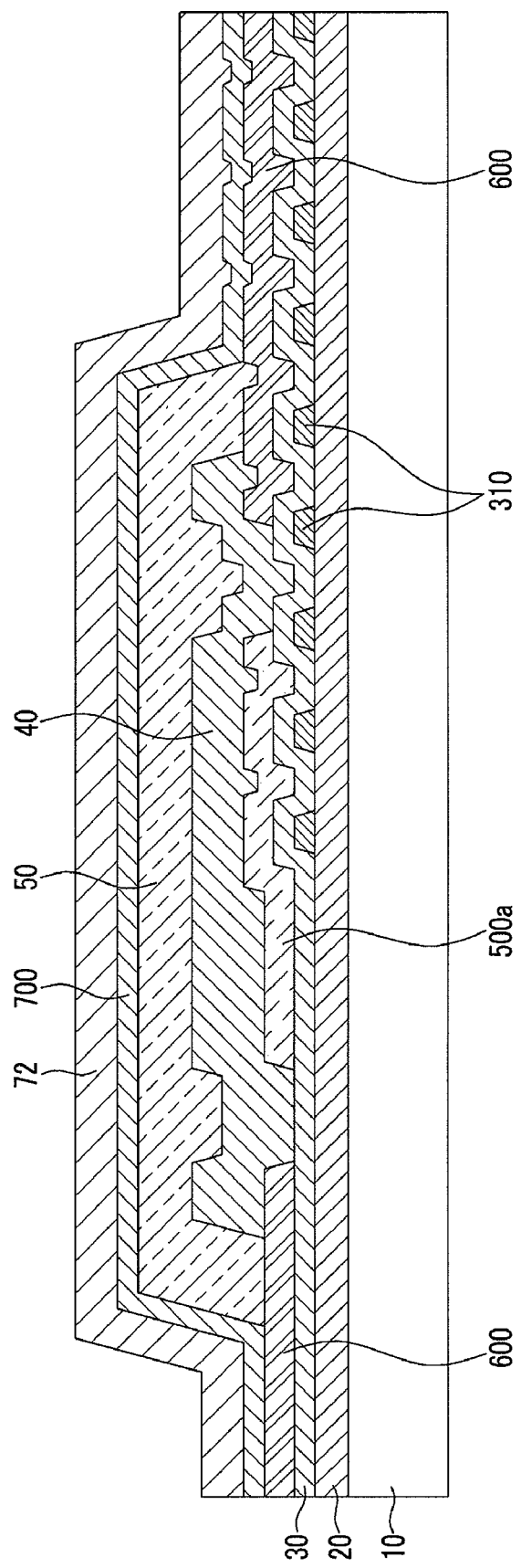
FIG. 2 is a cross-sectional view taken along section III-III' of FIG. 1.

As illustrated in FIG. 2, the two sections of the cathode power line (ELVSS) 600 are insulated from the power line (ELVDD) 500 by a passivation layer 40. The two sections of the cathode power line (ELVSS) 600 are electrically interconnected by a conductive layer 700 formed on the cathode power line (ELVSS) 600 and the power line (ELVDD) 500, both of which are formed on the substrate 10. The conductive layer 700 is described in greater detail below.

Returning to FIG. 1, the cathode power line (ELVSS) 600 is coupled to one power input terminal 600*a* in the illustrated embodiment. The length and width of the cathode power line (ELVSS) 600 are substantially identical to those of the power line (ELVDD) 500. In some embodiments, the uniformity of the width of the cathode power line (ELVSS) 600 is at least about 70%, at least about 75%, at least about 80%, at least about 85%, at least about 90%, at least about 95%, at least about 97%, at least about 99%, and/or at least about 99.5%.

FIG. 2 is a cross-sectional view of the display 1000 taken along section III-III' of FIG. 1. The OLED display 1000 comprises the substrate 10, a buffer layer 20, a plurality of data lines 310, a gate insulating layer 30, the power input terminal 500*a*, the cathode power line (ELVSS) 600, a passivation layer 40, an over-coating layer 50, and the conductive layer 700.

The substrate 10 may be formed from any suitable material, for example, an insulating material such as glass or plastic, or a metallic material such as stainless steel (SUS). The buffer layer 20 prevents impurities in the substrate 10 from diffusing into an active layer 21 (FIG. 3) formed on the display region 100. In some embodiments, the buffer layer 20 comprises silicon nitride (SiN) and/or a multilayer structure comprising a silicon nitride (SiN) layer and a silicon oxide ($SiO_2$) layer.

The plurality of data lines 310 are formed on the buffer layer 20. The data lines 310 are coupled to the data driver 300, and provide a data voltage $V_{data}$ to each of the pixels.

In the illustrated embodiment, the gate insulating layer 30 is formed on the data lines 310 and the buffer layer 20. The cathode power line (ELVSS) 600 and the power line (ELVDD) 500 are formed on the gate insulating layer 30. As described above, in the illustrated embodiment, the cathode power line (ELVSS) 600 is divided into the two sections between which the power input terminal 500*a* of the power line (ELVDD) 500 is disposed. The two sections of the cathode power line (ELVSS) 600 formed on the same layer. The cathode power line (ELVSS) 600 is insulated from the power line (ELVDD) 500 by the passivation layer 40. The over-coating layer 50, which planarizes the surface of the passivation layer 40, is formed on the passivation layer 40. The conductive layer 700 is formed on the over-coating layer 50. The protecting layer 72 is formed on the conductive layer 700 to cover the conductive layer 700. The protecting layer 72 may be formed of same materials are used in a pixel-dividing layer 70 that will be described detailed below.

The conductive layer 700 electrically couples the two sections of the cathode power line (ELVSS) 600, thereby providing the relatively smaller of the two sections of the cathode power line (ELVSS) 600 with a substantially uniform cathode voltage. Because, the voltage drop along the cathode power line 600 is reduced, the luminance uniformity of the pixels is improved. In the illustrated embodiment, the conductive layer 700 is formed together with the anode electrode 51 (FIG. 3) of the OLED element, thereby improving the process flow in the manufacture of the display 1000. Accordingly, in the illustrated embodiment, the conductive layer 700 comprises the same material as the anode electrode 51. For example, the conductive layer 700 may be formed of indium tin oxide (ITO) or indium zinc oxide (IZO) in some embodiments, although those skilled in the art will understand that other suitable material are used in other embodiments.

FIG. 3 is a cross-sectional view taken along section IV-IV' in FIG. 1. FIG. 3 illustrates the buffer layer 20 formed on the substrate 10 and a thin film transistor (TFT) T formed on the buffer layer 20. The TFT T comprises an active layer 21, a source electrode 22, a drain electrode 23, and a gate electrode 31 that are formed on the buffer layer 20. The active layer 21 comprises a source region 211, a drain region 212, and a channel region 213 interconnecting the source and drain regions 211 and 212.

The gate insulating layer 30 is formed on the buffer layer 20 and covers the active layer 21. The gate electrode 31 is formed on the active layer 21 with the gate insulating layer 30 interposed therebetween.

An interlayer insulating layer 41 is formed on the gate insulating layer 30, covering the gate electrode 31. First contact holes 301 and 302 and second contact holes 411 and 412 are formed through the gate insulating layer 30 and the interlayer insulating layer 41, respectively, thereby exposing the source and drain regions 211 and 212. The source and drain electrodes 22 and 23 are electrically coupled to the exposed portions of the source and drain regions 211 and 212, respectively.

The over-coating layer 50 is formed on the interlayer insulating layer 41, thereby covering the TFT T. The anode electrode 51, the organic light emitting layer 52, and the cathode electrode 650 are formed, in that order, on the over-coating layer 50, and together form an OLED element L. The anode electrode 51 is electrically coupled to the drain electrode 23 of the TFT T through a via hole 501 formed in the over-coating layer 50. A pixel-dividing layer electronically isolates the anode electrode 51 from the anode electrode (not shown) of an adjacent pixel. The anode electrode 51 contacts the organic light emitting layer 52 through an opening 701 formed in the pixel-dividing layer 70. The cathode electrode 650 is, as shown in FIG. 1, formed on an entire surface of the substrate 10 to provide a common cathode voltage to the plurality of pixels P. In other embodiments, the cathode electrode 650 is formed on at least the display area 100. The anode electrode 51 injects holes and the cathode electrode 650 injects electrons into the organic light emitting layer 52.

Accordingly, because the widths of the power line (ELVDD) 500 and cathode power line (ELVSS) 600 are substantially the same, a voltage drop caused by line resistance is reduced, resulting in improved voltage uniformity in the power line (ELVDD) 500 and cathode power line (ELVSS) 600. In turn, the improved voltage uniformity results in improved luminance uniformity in the pixels P, as well as reduced degradation and improved lifetime of the OLED elements and of the display.

While exemplary embodiments are disclosed herein, the scope of this disclosure is not limited to the disclosed embodiments, but, is intended to cover various modifications and equivalent arrangements understood by those skilled in the art within the spirit and scope there.

What is claimed is:

1. An organic light emitting diode display comprising:
   a substrate comprising a pixel area and a non-pixel area;
   a plurality of pixels formed in the pixel area, each pixel comprising a thin film transistor and an organic light emitting diode element;
   a power line formed with a substantially uniform width in the non-pixel area configured to supply a common power voltage to the plurality of pixels, wherein the power line is formed on only one side of the pixel area;
   a cathode electrode formed on the substrate;
   a cathode power line formed in the non-pixel area on a same layer as the power line and on the only one side of the pixel area, coupled to the cathode electrode, and configured to supply a cathode voltage to the pixels;
   a cathode power input terminal coupled to the cathode power line; and
   a power input terminal coupled to the power line, wherein the power input terminal crosses the cathode power line.

2. The organic light emitting diode display of claim 1, wherein at least a portion of the cathode power line is disposed in parallel with the power line and electrically insulated from the power line.

3. The organic light emitting diode display of claim 2, wherein a width of the cathode power line is substantially identical with a width of the power line.

4. The organic light emitting diode display of claim 3, wherein a length of the cathode power line is substantially the same as a length of the power line.

5. The organic light emitting diode display of claim 3, wherein the cathode power line is coupled to the cathode electrode over substantially the full length of the cathode power line.

6. An organic light emitting diode display comprising:
   a substrate comprising a pixel area and a non-pixel area;
   a plurality of pixels formed in the pixel area, each pixel comprising a thin film transistor and an organic light emitting diode element;
   a power line formed with a substantially uniform width in the non-pixel area configured to supply a common power voltage to the plurality of pixels, wherein the power line is formed on only one side of the pixel area;
   a cathode electrode formed on the substrate;
   a cathode power line formed in the non-pixel area on a same layer as the power line and on the only one side of the pixel area, coupled to the cathode electrode, and configured to supply a cathode voltage to the pixels; and
   at least one power input terminal coupled to each of the power line and the cathode power line,
   wherein the cathode power line comprises two sections between which are disposed a power input terminal of the power line.

7. The organic light emitting diode display of claim 6, wherein the two sections of the cathode power line are electrically insulated from the power line.

8. The organic light emitting diode display of claim 6, wherein a conductive layer formed on a different layer from the power line electrically interconnects the two sections of the cathode power line.

9. The organic light emitting diode display of claim 8, further comprising:
   a passivation layer formed between the cathode power line and the power line, wherein the passivation layer insulates the cathode power line from the power line; and
   an over-coating layer formed on the passivation layer.

10. The organic light emitting diode display of claim 8, wherein the conductive layer and an electrode of the organic light emitting diode element comprise the same material.

11. The organic light emitting diode display of claim 10, wherein the electrode is an anode.

12. A method for manufacturing an organic light emitting diode display, the method comprising:
   forming a plurality of pixels in a pixel area of a substrate, wherein each pixel comprises a this film transistor and an organic light emitting diode element;
   forming a power line with a substantially uniform width on a non-pixel area of the substrate, wherein the power line is coupled to the plurality of pixels, and wherein the power line is formed on only one side of the pixel area;
   forming a cathode power line on the non-pixel area of the substrate on the only one side of the pixel area, wherein the power line and cathode power line are formed on a common layer;
   forming at least one power input terminal coupled to the power line, wherein the power input terminal crosses the cathode power line; and
   forming a cathode terminal on the substrate, wherein the cathode terminal is coupled to the cathode power line and the plurality of pixels.

13. The method of claim 12, further comprising:
   forming a passivation layer between the cathode power line and the power line, wherein the passivation layer insulates the cathode power line from the power line; and
   forming an over-coating layer on the passivation layer.

14. The method of claim 12, wherein forming the cathode power line comprises forming at least a portion of the cathode power line in parallel with the power line and electrically insulated from the power line.

15. The method of claim 12, wherein forming the cathode power line comprises forming a cathode power line with a width that is substantially identical with a width of the power line.

16. The method of claim 12, wherein forming the cathode power line comprises forming a cathode power line with a length that is substantially the same as a length of the power line.

17. The method of claim 12, wherein the cathode terminal is coupled to the cathode power line over substantially the full length of the cathode power line.

18. A method for manufacturing an organic light emitting diode display, the method comprising:
- forming a plurality of pixels in a pixel area of a substrate, wherein each pixel comprises a this film transistor and an organic light emitting diode element;
- forming a power line with a substantially uniform width on a non-pixel area of the substrate, wherein the power line is coupled to the plurality of pixels, and wherein the power line is formed on only one side of the pixel area;
- forming a cathode power line on the non-pixel area of the substrate on the only one side of the pixel area; wherein the power line and cathode power line are formed on a common layer;
- forming at least one power input terminal coupled to the power line;
- forming a cathode terminal on the substrate, wherein the cathode terminal is coupled to the cathode power line and the plurality of pixels;
- forming the cathode power line comprises forming first and second sections of the cathode power line; and
- forming at least one power input terminal comprises forming a power input terminal disposed between the first and second sections of the cathode power line.

19. The method of claim 18, further comprising forming a conductive layer on a different layer from the power line, wherein the conductive layer electrically interconnects the first and second sections of the cathode power line.

20. The method of claim 19, wherein forming a conductive layer also comprises forming an electrode of the organic light emitting diode element.

* * * * *